United States Patent
Okanobu

[11] Patent Number: 5,942,935
[45] Date of Patent: *Aug. 24, 1999

[54] FILTER CIRCUIT

[75] Inventor: Taiwa Okanobu, Tokyo, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/907,268

[22] Filed: Aug. 6, 1997

Related U.S. Application Data

[63] Continuation of application No. 08/580,314, Dec. 28, 1995, abandoned.

[30] Foreign Application Priority Data

Jan. 6, 1995 [JP] Japan ................................... 7-016457

[51] Int. Cl.$^6$ ................................................. H03K 5/00
[52] U.S. Cl. ........................ 327/553; 327/552; 327/308; 327/558
[58] Field of Search .................................. 327/552, 553, 327/555, 556, 557, 558, 559, 156, 308

[56] References Cited

U.S. PATENT DOCUMENTS

| 5,023,491 | 6/1991 | Koyama | 327/553 |
|---|---|---|---|
| 5,300,838 | 4/1994 | Elizondo | 307/521 |
| 5,341,249 | 8/1994 | Abbott et al. | 360/46 |
| 5,625,317 | 4/1997 | Deveirman | 327/553 |

FOREIGN PATENT DOCUMENTS

| 405110380 | 4/1993 | Japan | 327/553 |
|---|---|---|---|
| 2194401 | 3/1988 | United Kingdom | H03H 11/54 |

*Primary Examiner*—Dinh T. Le
*Attorney, Agent, or Firm*—Jay H. Maioli

[57] ABSTRACT

A filter device suitable for being integrated into a single IC chip comprises a reference signal generator, a first filter circuit, a second filter circuit, a phase-comparator circuit, and a low-pass filter. The reference signal generator is for generating a reference signal. The first filter circuit is connected between an input terminal and an output terminal of the filter device and has a first variable time constant circuit. The second filter circuit has a second variable time constant circuit similar to the first variable time constant circuit and is provided with the reference signal from the reference signal generator. The phase-comparator circuit is for comparing the phase of the reference signal with the phase of an output signal of the second filter circuit to generate an output signal based on the result of this comparison. The low-pass filter is for averaging the output signal of the phase comparator circuit and providing the averaged output signal to both the first and second variable time constant circuits of the first and second filter circuits as a control signal to adjust the time constants of the first and second variable time constant circuits.

4 Claims, 11 Drawing Sheets

FILTER CIRCUIT

This is a continuation of application Ser. No. 08/580,314 filed Dec. 28, 1995, now abandoned.

BACKGROUND OF THE INVENTION

The present invention relates to a filter circuit suitable for being integrated into a single IC chip.

The channel frequencies for low power-type cordless telephones in Japan are as follows.

| | |
|---|---|
| up link channel (portable unit to base unit) | 381 MHz band. |
| down link channel (base unit to portable unit) | 254 MHz band. |
| channel interval | 12.5 kHz. |

FIG. 1 and FIG. 2 show typical receiving and transmitting circuits of a cordless telephone. Herein, lines indicated by symbols *1 and *2 in FIG. 1 and FIG. 2 should be connected to form full configuration of the circuits. These circuits meet the above standard and may be incorporated on a single chip of an IC (integrated circuit). This IC chip is designed to be usable in both of a base unit (base-side telephone) and a portable unit (portable telephone).

In FIG. 1 and FIG. 2, the portion surrounded by the dotted line is incorporated in a single chip. These figures show the IC1 used for the portable unit with the receiving and transmitting circuits respectively designated with reference numerals 10 and 40.

The receiving circuit 10 has a direct conversion-type structure employing a double super-heterodyning method. A down link channel FM signal Sr from the base unit is received by the antenna 2 and then the received signal is provided to first mixer circuits 12 and 22 for performing an orthogonal transformation to an I axis and a Q axis via a terminal T11, a high frequency amplifier 11, a terminal T12, a band-pass filter 3 that allows all of the down channels to band-pass and terminal T13.

Further, an oscillating circuit 30 generates a signal S30 with a stable reference frequency of, for example, 14.4 MHz. To attain this, a crystal oscillating circuit 6 is connected via the terminal T16.

The oscillated signal S30 from the oscillating circuit 30 is provided to a frequency dividing circuit 33, and to a frequency circuit 35 which divides an input frequency into $1/1152$, thereby the signal S35 with a frequency of 12.5 kHz corresponding to the channel spacing is produced. This signal S35 is then provided to a PLL (phase locked loop) 31 as the reference frequency signal. The PLL 31 has a variable frequency dividing (not shown) to which a dividing ratio N31 is provided via a terminal T17 to be set therewithin.

The oscillated signal S31 with a frequency equal to the carrier frequency of the FM signal Sr is generated from the VCO311 of the PLL circuit 31.

The signal S31 is provided to the first mixer circuit 12 as a first local oscillated signal and provided to a phase-shifting circuit 32 where the signal S31 is phase-shifted by just $\pi/2$. The phase-shifted signal S32 is provided to the first mixer 22 as the first local oscillated signal.

Therefore, as shown in FIG. 3A, the received signal Sr has a signal component Sa within the lower side waveband and a signal component Sb within the upper side waveband. Further, taking $\omega o$: the carrier frequency (angular frequency) of the received signal Sr $\omega a$: angular frequency of signal component Sa. $\omega a < \omega o$ Ea: amplitude of signal component Sa $\omega b$: angular frequency of signal component Sb. $\omega b < \omega o$ Eb: amplitude of signal component Sb $\Delta \omega a = \omega o - \omega a$ $\Delta \omega b = \omega b - \omega o$, then, Sr=Sa+Sb Sa=Ea·sin $\omega$at Sb=Eb·sin $\omega$bt.

Further, taking

E1: the amplitude of the first local oscillated signals S31 and S32, then

S31=E1·sin $\omega$ot

S32=E1·cos $\omega$ot.

Therefore, taking

S12, S22: output signals of the mixer circuits 12 and 22, then, $$
\begin{aligned}
S12 &= Sr \cdot S31 \\
&= (Ea \cdot \sin\omega at + Eb \cdot \sin\omega bt) \times E1 \cdot \sin\omega ot \\
&= \alpha a\{-\cos(\omega a + \omega o)t + \cos(\omega o - \omega a)t\} + \\
&\quad \alpha b\{-\cos(\omega b + \omega o)t + \cos(\omega b - \omega o)t\} \\
&= \alpha a\{-\cos(\omega a + \omega o)t + \cos\Delta\omega at\} + \\
&\quad \alpha b\{-\cos(\omega b + \omega o)t + \cos\Delta\omega bt\}
\end{aligned}
$$

$$
\begin{aligned}
S22 &= Sr \cdot S32 \\
&= (Ea \cdot \sin\omega at + Eb \cdot \sin\omega bt) \times E1 \cdot \cos\omega ot \\
&= \alpha a[\sin(\omega a + \omega o)t - \sin(\omega o - \omega a)t] + \\
&\quad \alpha b\{\sin(\omega b + \omega o)t + \sin(\omega b - \omega o)t\} \\
&= \alpha a\{\sin(\omega a + \omega o)t - \sin\Delta\omega at\} + \\
&\quad \alpha b\{\sin(\omega b + \omega o)t + \sin\Delta\omega bt\}
\end{aligned}
$$

wherein $\alpha a = Ea \cdot E1 / 2$ $\alpha b = Eb \cdot E1 / 2.$

The signals S12 and S22 are provided to the low-pass filters 13 and 23 since the signal components with the angular frequencies $\Delta\omega a$ and $\Delta\omega b$ are necessary for an intermediate frequency (hereinafter referred to as IF) signal. The signal components with the angular frequencies $\Delta\omega a$ and $\Delta\omega b$ are provided as the first IF signals S13 and S23 from the low-pass filter 13. The signals S13 and S23 are expressed as follows:

S13=$\alpha$a·cos $\Delta\omega$at+$\alpha$b·cos $\Delta\omega$bt

S23=−$\alpha$a·sin $\Delta\omega$at+$\alpha$b·sin $\Delta\omega$bt.

In this case, as being apparent from the above equations and FIG. 3A, the signals S13 and S23 are base-band signals.

These signals S13 and S23 are provided to the second mixer circuits 14 and 24 respectively for I axis and Q axis of orthogonal transformation.

The oscillated signal S30 from the oscillating circuit 30 is provided to the frequency dividing circuit 33 and divided into a relatively low frequency signal S33. For example, the signal S33 is divided by 262 to a frequency of about 55 kHz. This signal S33 is provided to the second mixer circuit 14 as the second local oscillated signal and provided to the phase-shifting circuit 34. The phase-shifting circuit 34 phase-shifts this signal S33 by $\pi/2$. The phase-shifted signal S34 is provided to the mixer 24 as the second local oscillated signal.

Therefore, taking

S33=E2·sin ωst

S34=E2·cos ωst wherein

E2: amplitude of second local oscillating signals S33 and S34

ωs=2πfs (fs=approximately 55 kHz)

and taking:

S14, S24: output signals from the mixers 14 and 24, then, $$S14 = S13 \cdot S33$$
$$= (\alpha a \cdot \cos\Delta\omega a t + \alpha b \cdot \cos\Delta\omega b t) \times E2 \cdot \sin\omega s t$$
$$= \beta a\{\sin(\Delta\omega a + \omega s)t - \sin(\Delta\omega a - \omega s)t\} +$$
$$\beta b\{\sin(\Delta\omega b + \omega s)t - \sin(\Delta\omega b - \omega s)t\}$$

$$S24 = S23 \cdot S34$$
$$= (-\alpha a \cdot \sin\Delta\omega a t + \alpha b \cdot \sin\Delta\omega b t) \times E2 \cdot \cos\omega s t$$
$$= -\beta a\{\sin(\Delta\omega a + \omega s)t + \sin(\Delta\omega a - \omega s)t\} +$$
$$\beta b\{\sin(\Delta\omega b + \omega s)t + \sin(\Delta\omega b - \omega s)t\}$$

wherein $$\beta a = \alpha a \cdot E2/2$$
$$\beta b = \alpha b \cdot E2/2.$$

The equations for signals S14 and S24 are transformed so that the value of the frequency difference does not become negative, $$S14 = \beta a\{\sin(\Delta\omega a + \omega s)t + \sin(\omega s - \Delta\omega a)t\} +$$
$$\beta b\{\sin(\Delta\omega b + \omega s)t + \sin(\omega s - \Delta\omega b)t\}$$
$$= \beta a \cdot \sin(\omega s + \Delta\omega a)t + \beta a \cdot \sin(\omega s - \Delta\omega a)t +$$
$$\beta b \cdot \sin(\omega s + \Delta\omega b)t + \beta b \cdot \sin(\omega s - \Delta\omega b)t$$

$$S24 = -\beta a\{\sin(\Delta\omega a + \omega s)t - \sin(\omega s - \Delta\omega a)t\} +$$
$$\beta b\{\sin(\Delta\omega b + \omega s)t - \sin(\omega s - \Delta\omega b)t\}$$
$$= -\beta a \cdot \sin(\omega s + \Delta\omega a)t + \beta a \cdot \sin(\omega s - \Delta\omega a)t +$$
$$\beta b \cdot \sin(\omega s + \Delta\omega b)t - \beta b \cdot \sin(\omega s - \Delta\omega b)t$$

The signals S14 and S24 are then provided to an adding circuit 15 and added to each other. The resultant added signal S15 expressed by the following equation is provided from the adding circuit 15:

$$S15 = S14 + S24$$
$$= 2\beta a \cdot \sin(\omega s - \Delta\omega a)t + 2\beta b \cdot \sin(\omega s + \Delta\omega b)t.$$

The added signal S15 has signal components as shown in FIG. 3B. Thus, the signal S15 is produced from the received signal Sr by replacing the carrier frequency (angular frequency) ωo with ωs in the frequency conversion. The signal S15 is the second IF signal having intermediate frequency fs.

This second IF signal S15 is provided to the FM demodulating circuit 18 via a band-pass filter 16 as an IF filter and limiter amplifier 17 and is demodulated to an audio signal or digital data for controlling a procedure such as protocol.

The demodulated audio signal is provided to a speaker 4 for a telephone receiver via low-pass filters 25 and 26 for removing unnecessary band components, an amplifier 27 and the signal line of terminal T14.

The demodulated digital data is provided to a microcomputer for system control (not shown in the drawings) via terminal T24, the low-pass filter 25 and the band-pass filter 28.

The above description is for the configuration and operation of the receiving circuit 10.

At the transmitting circuit 40, the audio signal is made to be an up channel FM signal. The frequency divided signal S35 from the frequency dividing circuit 35 is provided to a PLL 43 as a reference frequency signal and a signal defining a dividing ratio N43 is provided to the variable frequency dividing circuit (not shown in the drawings) of the PLL 43 via terminal T18.

During transmission of the audio signal, a control signal from the microcomputer is provided to the switching circuit 47 via the terminal T26 and the switching circuit 47 is connected in the state shown in the drawings. The audio signal from a microphone 5 of the telephone transmitter is then provided to a VCO 431 of the PLL 43 as an oscillating frequency control signal via terminal T15, an amplifier 41, a low-pass filter 42 for removing unnecessary band components and the switching circuit 47.

An FM signal St, which is frequency modulated by the audio signal from the low-pass filter 42, is thus provided from the VCO 431 in the up link channel paired with the down link channel in the receiving circuit 10.

This FM signal St is provided to the antenna 2 via a drive amplifier 44, an output amplifier 45 and a terminal T19 before being transmitted to the base unit (not shown in the drawings).

Further, when digital data for controlling protocol etc. is transmitted, the switching circuit 47 is connected to the opposite contact in a state reverse to that shown in FIG. 2 by the control signal from terminal T26. Digital data from the microcomputer is provided to the VCO 431 of the PLL 43 as an oscillating frequency control signal via terminal T25, the low-pass filter 46 for removing unnecessary band components and the switching circuit 47.

An FM signal St which is frequency modulated (MSK modulated) by the digital data is then provided from the VCO 431.

The FM signal St is provided to the antenna 2 via a drive amplifier 44, an output amplifier 45 and a terminal T19.

The above description is for the configuration and operation of the transmitting circuit 40.

With typical FM receivers, the intermediate frequency is as high as 10.7 MHz. An intermediate frequency filter should therefore be constructed from ceramic filters, so that they cannot be integrated into an IC.

However, with the aforementioned receiving circuit 10, the first IF signals S12 and S22 are base-band signals and the second intermediate frequency fs may be such a lower one as being 55 kHz. The filters 13, 23 and 16 may therefore be composed using active filters having resistors, capacitors and amplifiers. Further, the filters 25, 26 and 28 may also have the same active filter structure since these filters are used only for audio bands.

The receiving circuit 10 may therefore be integrated into an IC by excluding the band-pass filter 3 and the oscillating coil (not shown in the drawings). The same also applies to the transmitting circuit 40.

The whole of the receiving circuit 10 and transmitting circuit 40 shown in FIG. 1 and FIG. 2 may therefore be formed into a single monolithic IC.

In FIG. 1 and FIG. 2, this IC1 is used for a portable unit. However, this IC may also operate in a base unit by connecting terminals T14 and T15 to a 4 line/2 line conversion circuit of a base unit and replacing the frequency dividing ratios N31 with N43. Then, in this case, receiving of the up link channel signal is carried out by the receiving circuit 10 and transmission of the down link channel signal is carried out by the transmitting circuit 20.

The IC IC1 is therefore usable in a base unit. That is, the IC IC1 is also usable in both a portable unit and a base unit.

Of the filters 13, 23, 16, 25, 26, 28, 42 and 46 described above, the low-pass filters may be composed as is exemplified in FIG. 4 and the band-pass filters may be composed as is exemplified in FIG. 5.

The cut-off frequency fLOW of the low-pass filters is then expressed by $$fLOW = \frac{1}{2}\{2\pi(C1 \cdot C2 \cdot R2 \cdot R3)^{**}0.5\},$$

and the central frequency fBPF and sharpness QBPF are expressed by $$fBPF = 1/\{2\pi(C1 \cdot C2 \cdot R1 \cdot R2)^{**}0.5\}$$

$$QBPF = (\frac{1}{2})(R2/R1)^{**}0.5.$$

(X**0.5 indicates X to the power of ½, as is the case in the following).

Variations in the relative values of the capacitors and resistors in the IC can be kept sufficiently small but those in the absolute values do become large. The temperature coefficients of the resistors in the IC are also large.

This affects the cut-off frequencies (central frequencies) of the filters 13 to 46 to vary together with temperature.

Therefore, there is a need for an apparatus for resolving such problems.

SUMMARY OF THE INVENTION

In the present invention, a filter device comprises a reference signal generator, a first filter circuit, a second filter circuit, a phase-comparator circuit, and a low-pass filter. The reference signal generator is for generating a reference signal. The first filter circuit is connected between an input terminal and an output terminal of the filter device, and has a first variable time constant circuit. The second filter circuit has a second variable time constant circuit similar to the first variable time constant circuit and is provided with the reference signal from the reference signal generator as an input signal. The phase-comparator circuit is for receiving the reference signal and an output signal of the second filter circuit and comparing the phase of the reference signal with the phase of the output signal of the second filter circuit to generate an output signal based on the result of this comparison. The low-pass filter is for averaging the output signal of the phase comparator circuit and providing the averaged output signal to both the first and second variable time constant circuits of the first and second filter circuits as a control signal to adjust the time constants of the first and second variable time constant circuits.

Further, the cut-off frequency of the second filter circuit may be equal to the frequency of the reference signal in a stable operation.

Moreover, the phase of the input signal and the phase of the output signal of the second filter circuit may differ by 90 degrees from each other at the cut-off frequency of the second filter.

In addition, the output signal of the phase comparator circuit has substantially zero level when a phase difference between the reference signal and the output signal of the second filter circuit is 90 degrees.

Still further, the first time constant circuit of the first filter circuit and the second time constant circuit of the second filter circuit include similar variable resistance circuits and capacitors. Here, the control signal from the low-pass filter circuit is provided to the variable resistance circuits of the first and second filter circuits to adjust resistance values of the variable resistance circuits.

The second filter circuit may be a secondary low-pass filter.

DETAILED DESCRIPTION OF THE PREFERRED EMBODIMENT

Figure 6:
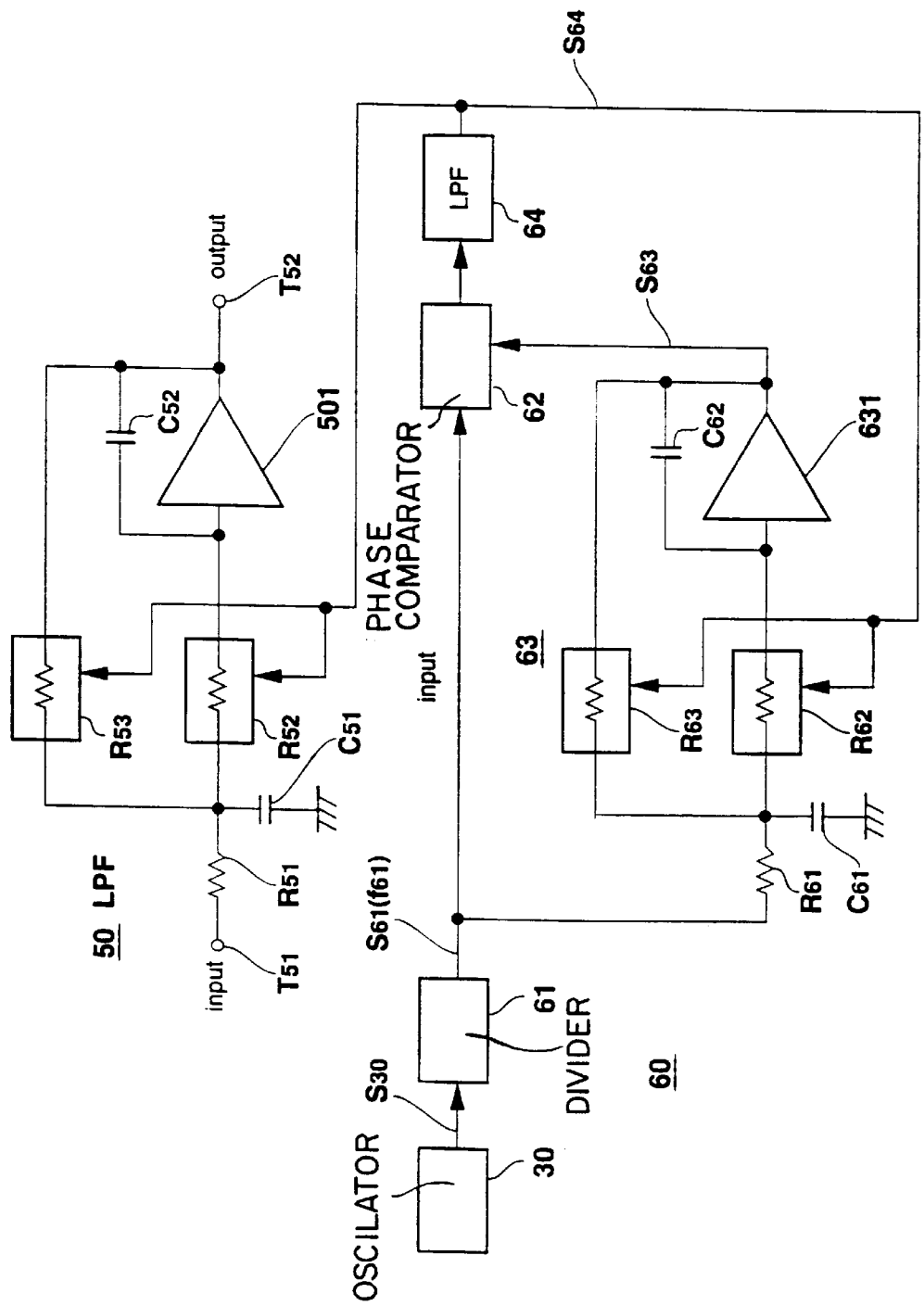
FIG. 6 is a system diagram showing an embodiment of the present invention.

In FIG. 6 showing a filter apparatus according to the present invention, numeral 50 designates a low-pass filter employed in the receiving circuit 10 and the transmitting circuit 40 described above. This low-pass filter 50 is composed as a secondary low-pass filter. An input terminal T51 is connected to an input terminal of an inverting amplifier 501 having sufficient gain via a resistor R51 and a variable resistance circuit R52. The output terminal of the inverting amplifier 501 is connected to an output terminal T52.

A capacitor C51 is connected between the connection point of the resistor R51 and the variable resistor R52 and ground. A capacitor C52 is connected between the output and input terminals of the inverting amplifier 501. A variable resistor R53 is connected between the output terminal of the inverting amplifier 501 and the connection point of the resistor R51 and the variable resistor R52.

The high frequency component of any signal provided to the terminal T51 is attenuated by the resistor R51 and C51. Furthermore, the negative feedback via the capacitor C52 reduces the gain of the inverting amplifier 501 in high frequency region so that the circuit 50 operates as a low-pass filter and an output signal thereof is provided from the terminal T52.

In this case, the cut-off frequency f50 of this low-pass filter circuit 50 is:

$$f50=1/\{2\pi(C51 \cdot C52 \cdot R52 \cdot R53)^{**}0.5\}.$$

Figure 7:
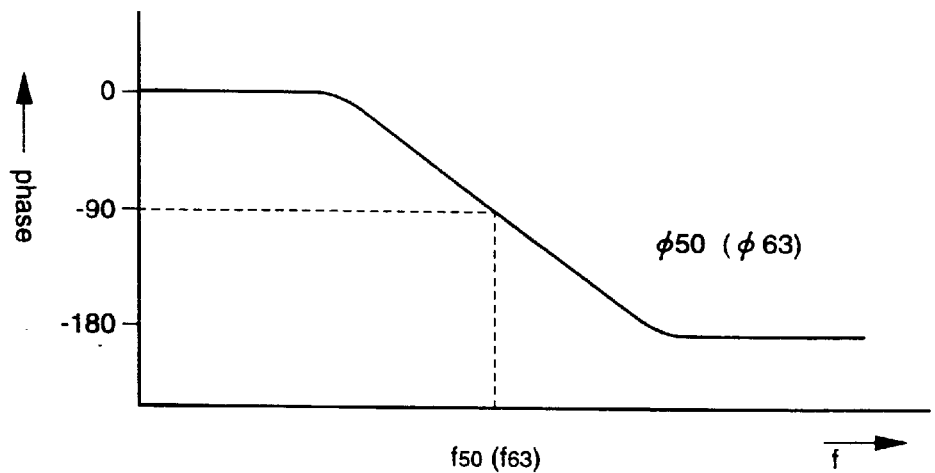
FIG. 7 is a graph showing a characteristic in the operation of the circuit of FIG. 1.

The phase φ50 of the output signal from the terminal T52 is delayed as the frequency becomes higher as exemplified in FIG. 7, and is delayed by 90° at the cut-off frequency f50.

Further, a characteristic stabilizing circuit 60 is provided for stabilizing the cut-off frequency f50 of the low-pass filter circuit 50 at a desired value using an output signal S64 of this characteristic stabilizing circuit 60.

That is, an oscillating signal S30 from an oscillating circuit 30 is provided to a frequency dividing circuit 61 and, for example, the frequency f61 is divided into ½₂₅₀ to provide a frequency divided signal S61 with a divided frequency of 6.4 kHz. This signal S61 is then provided to a phase comparator circuit 62 as a phase (or frequency) reference signal and is provided as an input signal to a phase-shifting circuit 63.

In this example, this phase-shifting circuit 63 is a low-pass filter having the same structure as the low-pass filter 50 with elements C61, C62 and R61, amplifier 631, and R62 and R63 respectively corresponding to elements C51, C52 and R51, the inverting amplifier 501, and R52 and R53. The output signal S63 of this phase-shifting circuit 63 is provided to the phase comparator circuit 62 as a comparison signal.

At this phase comparator circuit 62, the phase of the signal S63 is compared with the phase of the signal S61, this comparison resultant output is provided to the low-pass filter 64, and a d.c. signal S64 is produced as having a level corresponding to the phase-difference of the signals S63 and S61 provided to the low-pass filter. The phase comparator circuit 62 provides an output signal having substantially zero when the phase difference between its two input signals is 90 degrees. The signal S64 is then provided to the variable resistors R62 and R63 as a resistance value control signal, as well as being provided to the variable resistance circuits R52 and R53 as a resistance value control signal.

According to such structure, the resistance values of the variable resistance circuits R62 and R63 are varied with the signal S63, but the phase-shifting circuit 63 has the same construction as the low-pass filter circuit 50 and its cut-off frequency f63 is:

$$f63=1/\{2\pi(C61 \cdot C62 \cdot 62 \cdot R63)^{**}0.5\}.$$

At this time, the phase φ63 of the output signal S63 for the input signal S61 is delayed as the frequency becomes higher, in the same way as the phase φ50, as exemplified in FIG. 7, and is delayed by 90° at the cut-off frequency f63.

Then, in normal operation the signal S61 and the signal S63 have a phase difference of 90° in the phase comparator circuit 62 and at this time the phase delay at the phase-shifting circuit (low-pass filter) 63 is 90°. The phase-shifting circuit 63 gives this 90° phase delay at the cut-off frequency f63. Therefore, at this time, the cut-off frequency f63 of the phase-shifting circuit 63 is equal to the frequency f61(= 6.4kHz) of the signal S61.

That is, the cut-off frequency f63 of the phase-shifting circuit 63 is feedback controlled to be equal to the frequency f61 of the signal S61 that is taken as a reference.

At this time, the cut-off frequency f50 of the low-pass filter 50 is also controlled by the signal S64 controlling the cut-off frequency f63 of the phase-shifting circuit 63. Further, the differences in the relative values of the resistors and the capacitors in the IC are kept sufficiently small.

Therefore, if the cut-off frequency f50 of the low-pass filter circuit 50 is designed to have the same value as the cut-off frequency f63 of the phase-shifting circuit 63, the signal S64 controls the values of the variable resistance circuits R52 and R53 in the same way as for the values for the variable resistance circuits R62 and R63 and the cut-off frequency f50 of the low-pass filter circuit 50 becomes equal to the cut-off frequency f63 of the phase-shifting circuit 63. That is, the cut-off frequency f50 of the low-pass filter circuit 50 also becomes equal to the frequency f61 of the signal S61.

Further, even if the low-pass filter 50 has a design value of the cut-off frequency f50 that differs from the cut-off frequency f63 of the phase-shifting circuit 63, the values of corresponding elements in an IC vary with the same tendency by the same fraction, so that the resultant cut-off frequency f50 of the low-pass filter circuit 50 is compensated to be the design value.

According to the circuit in FIG. 6, even when the resistance values for R51 to R53 of the low-pass filter circuit 50 and the values of the capacitors C51 and C52 vary the values of the variable resistance circuits R52 and R53 are controlled so that the CR product becomes the design value and the desired cut-off frequency is obtained.

For the same reason, even if the resistance values for R51 to R53 vary due to temperature change, these variations are canceled out by variations in the signal S64 to cause no variation in the cut-off frequency.

Control of the cut-off frequency f50 of the low-pass filter circuit 50 can be carried out even with a switched capacitor. However, means for eliminating clock noise are necessary in using the switched capacitor because the low-pass filter circuit 50 is an analog filter. That is, a circuit structure for preventing induced noises becomes necessary not only in the main circuit path but also in other circuits, which is not suitable for a single chip IC.

However, according to the aforementioned structure, such noises are not generated and noise eliminating means are not necessary. Furthermore, the circuit can be provided without requiring adjustments after fabrication and without showing secular variation.

Figure 8:
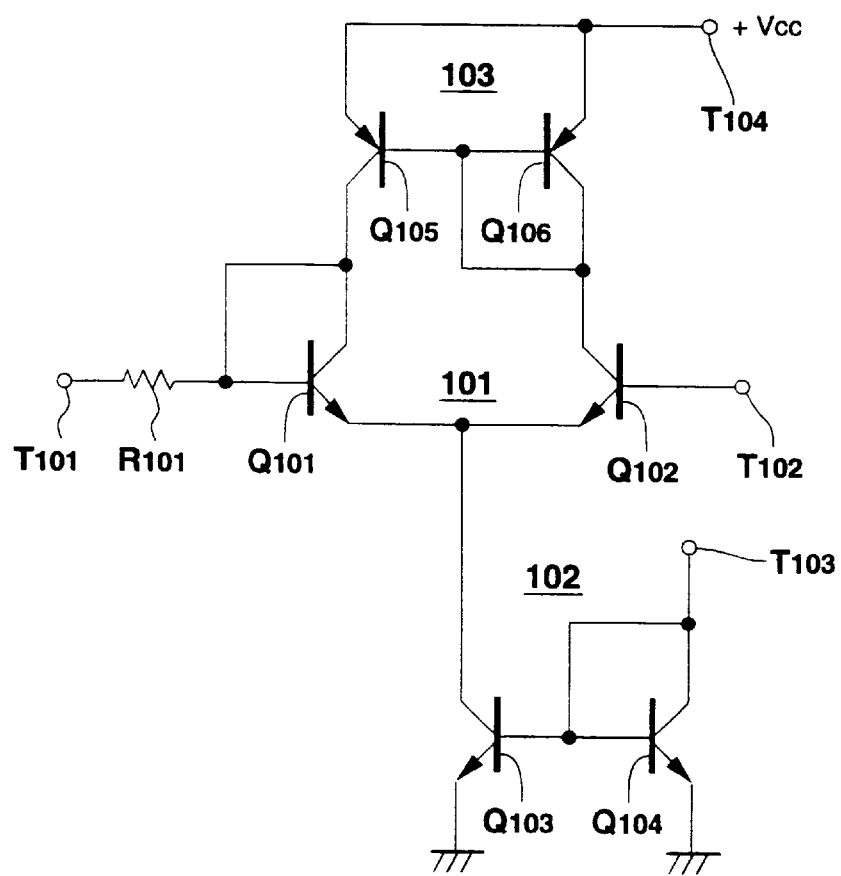
FIG. 8 is a circuit diagram showing an example of a variable resistance circuit.

FIG. 8 shows a specific example of the variable resistance circuits R52 to R63. The emitters of transistors Q101 and Q102 are connected to a collector of a constant current source transistor Q103 with the emitter grounded so as to construct a differential amplifier 101 having a ground as a reference potential point. The base of the transistor Q101 is connected to a terminal T101 via a resistor R101 (this includes the case where R101=0) and the base of the transistor Q102 is connected to terminal T102.

A current mirror circuit 102 is further formed with the transistors Q103 and Q104 having a reference point as being a ground. At this time the transistor Q103 is arranged on the output side and the transistor Q104 is on the input side with the collector thereof being connected to the control terminal T103.

Further, a current mirror circuit having a power supply terminal T014 as a reference potential is constructed using the transistors Q105 and Q106, with the transistor Q105 being arranged on the output side and the transistor Q106 being on the input side. The collectors of the transistors Q105 and Q106 are connected to the collectors of the transistors Q101 and Q102, respectively.

According to this structure, when;

RV: the resistance between terminal T101 and terminal T102 re: the emitter resistances of transistors Q101 and Q102, then, $$RV = R101 + 2re.$$

The emitter resistance re is then inversely proportional to the collector current of the transistor Q103 which is made to be equal to the control current provided to terminal T103 by the current mirror circuit 102.

This circuit therefore operates as a variable resistance circuit because the resistance value RV changes corresponding to the magnitude of the control current supplied to the terminal T103.

Figure 1:
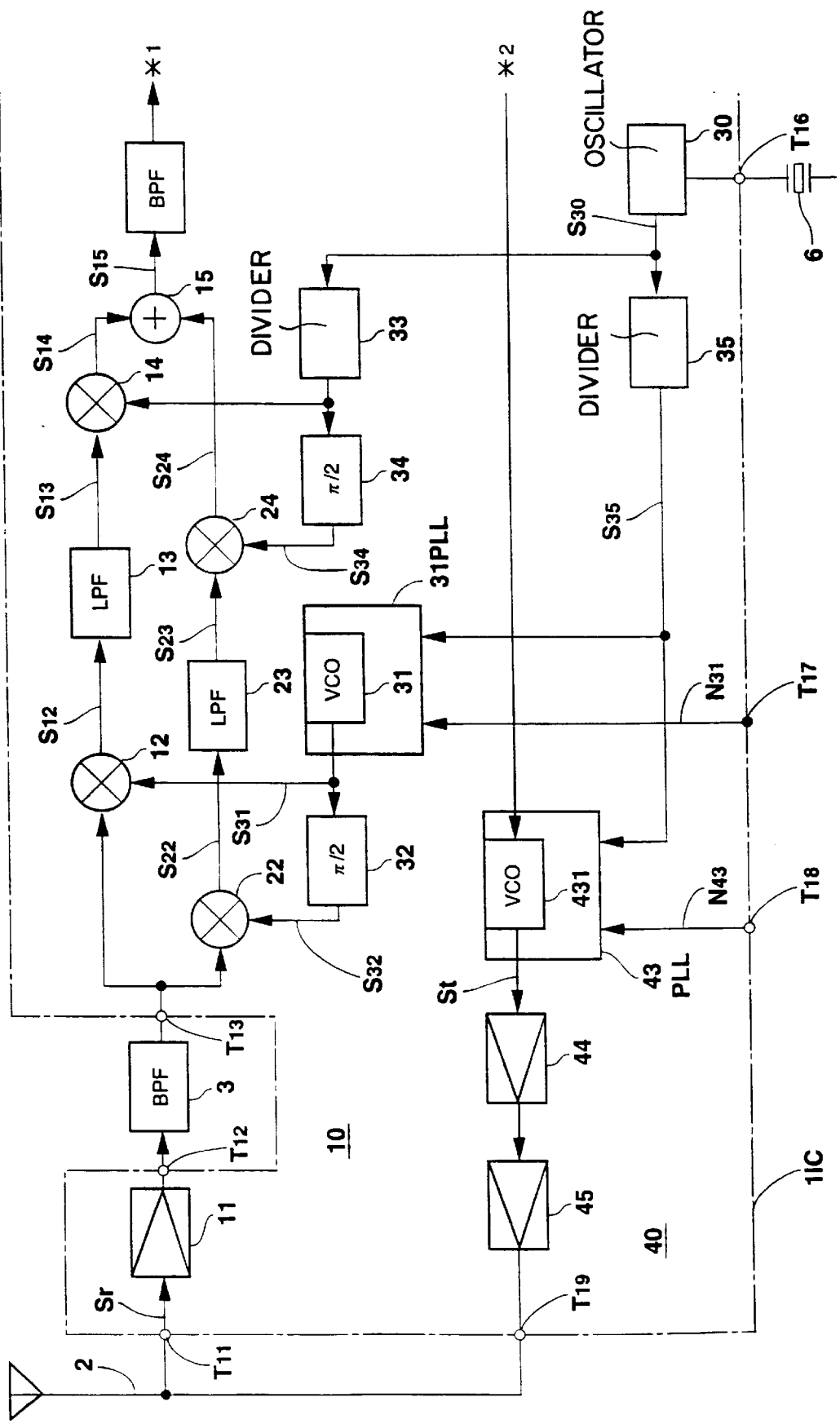
FIG. 1 is a system diagram showing an example of a part of a portable unit circuit of a cordless telephone.
Figure 2:
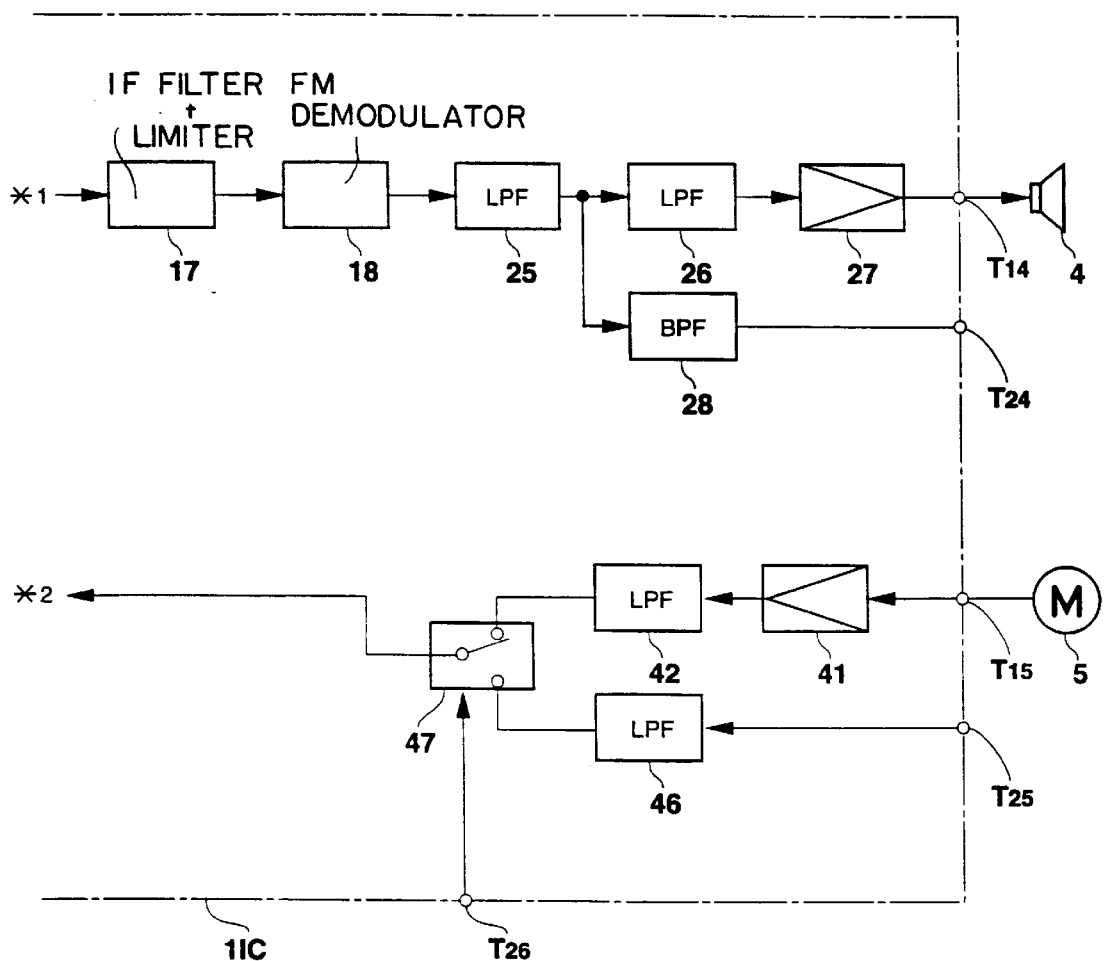
FIG. 2 is a system diagram showing a continuation of the example of FIG. 1.
Figure 3A:
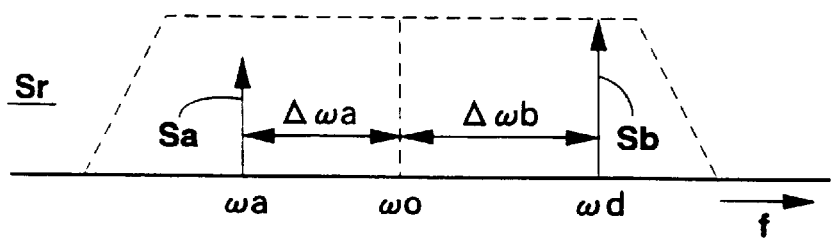
FIG. 3A and FIG. 3B are a diagram illustrating the operation of the circuit of FIG. 1 and FIG. 2.
Figure 3B:
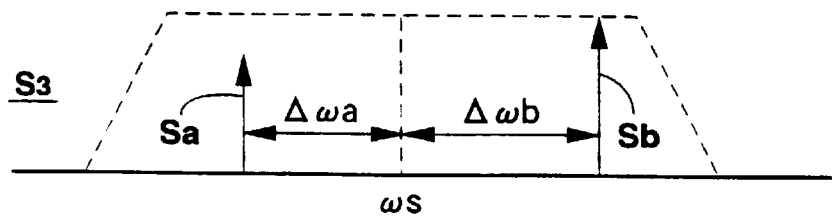
Figure 4:
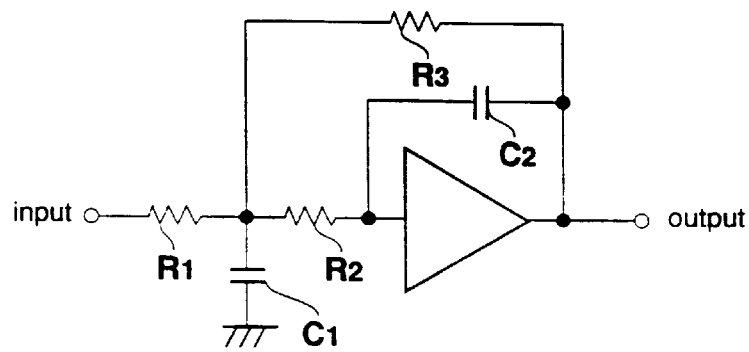
FIG. 4 is a circuit diagram showing an example of a low-pass filter.
Figure 9:
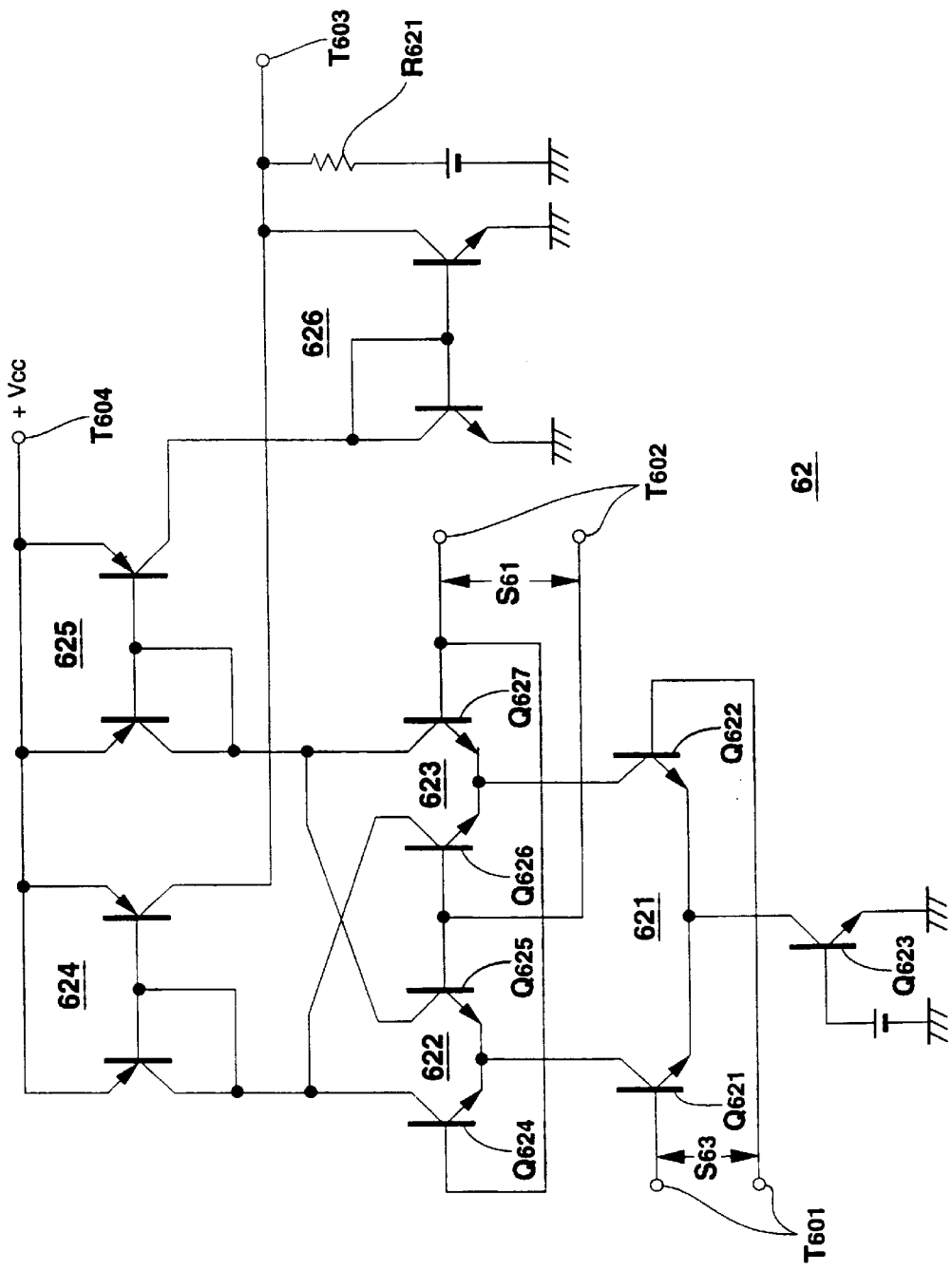
FIG. 9 is a circuit diagram showing an example of a phase comparator circuit.
Figure 10:
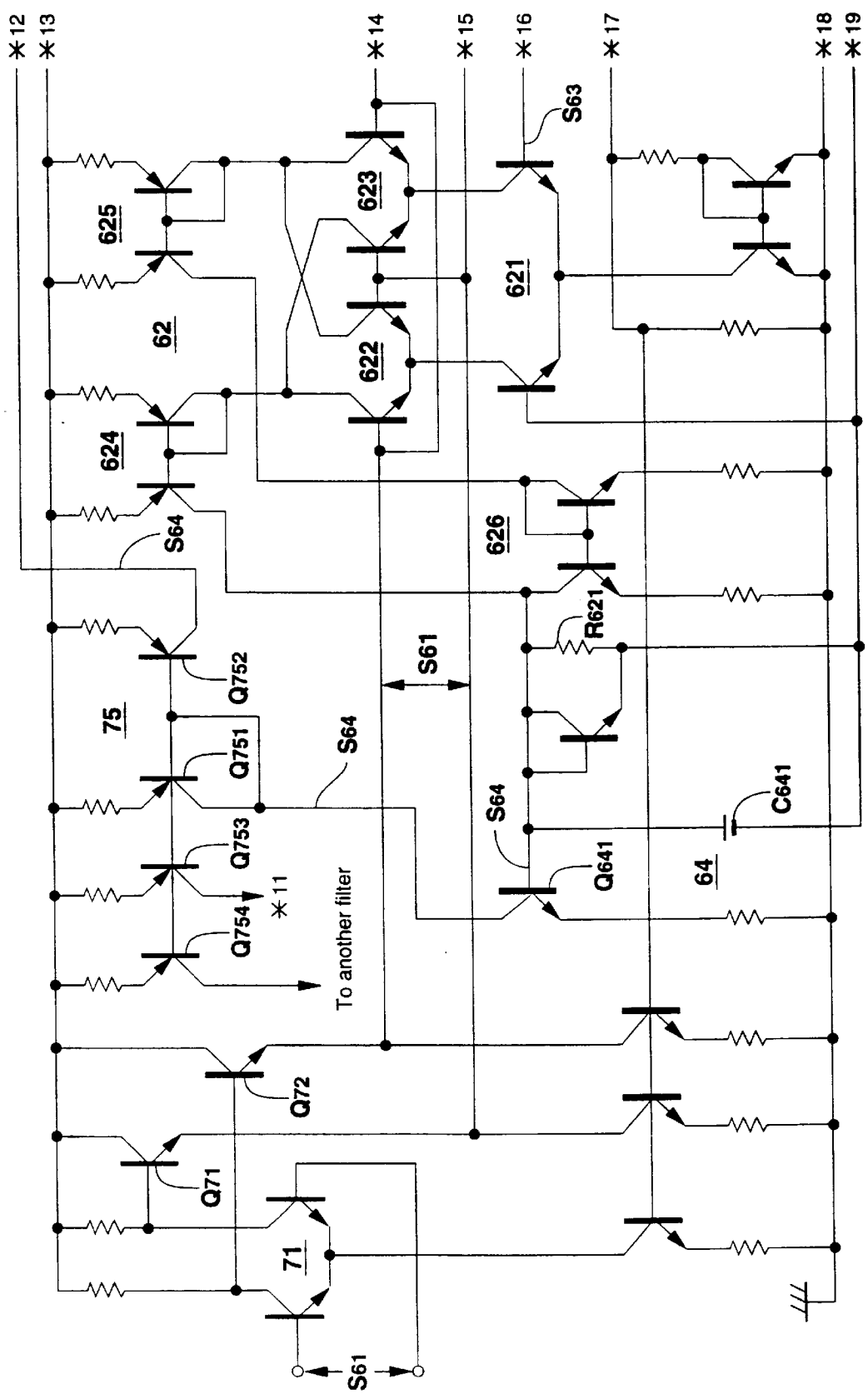
FIG. 10 is a circuit diagram showing a part of another embodiment of the present invention.
Figure 11:
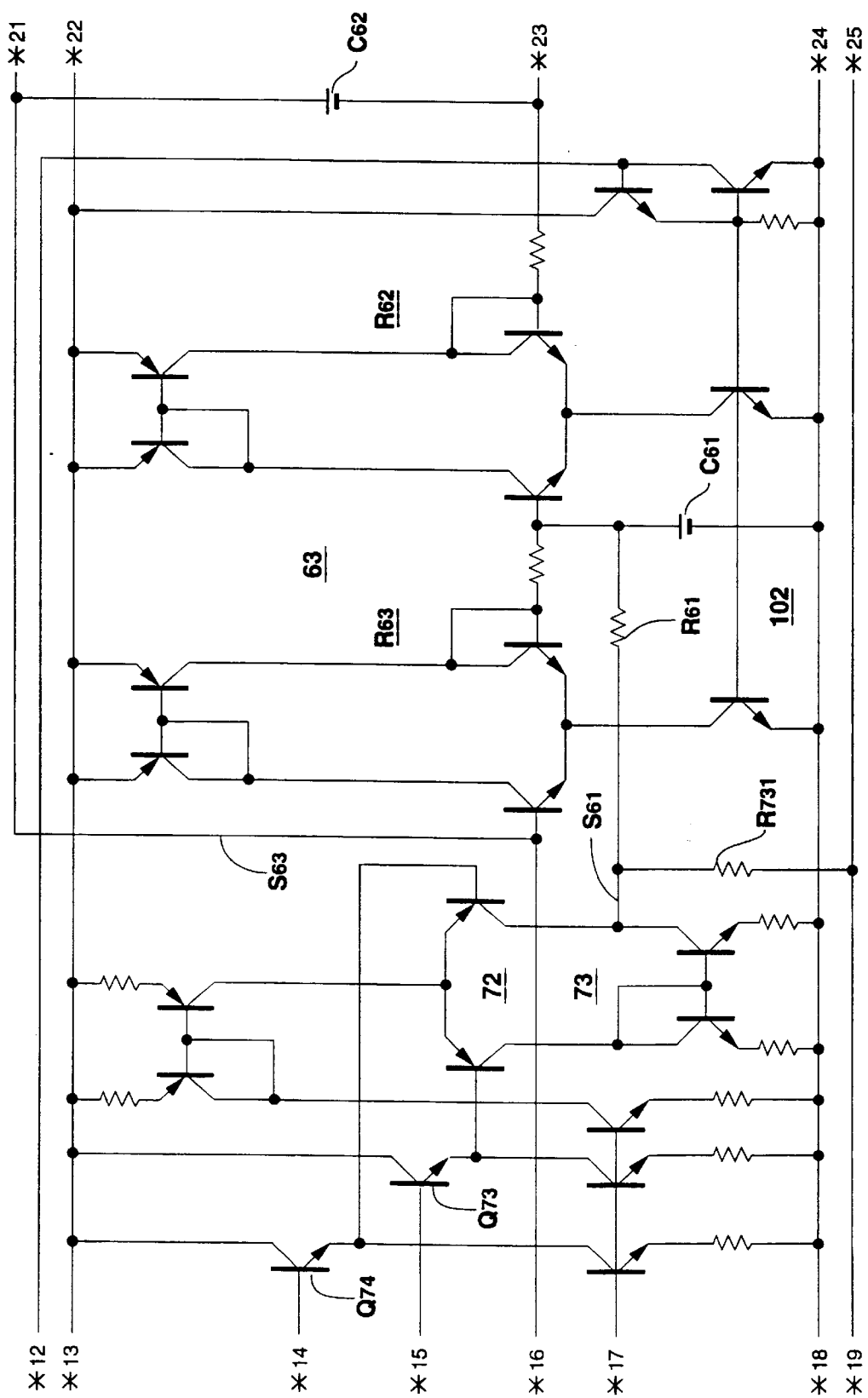
FIG. 11 is a circuit diagram showing a continuation of the embodiment of FIG. 10.
Figure 12:
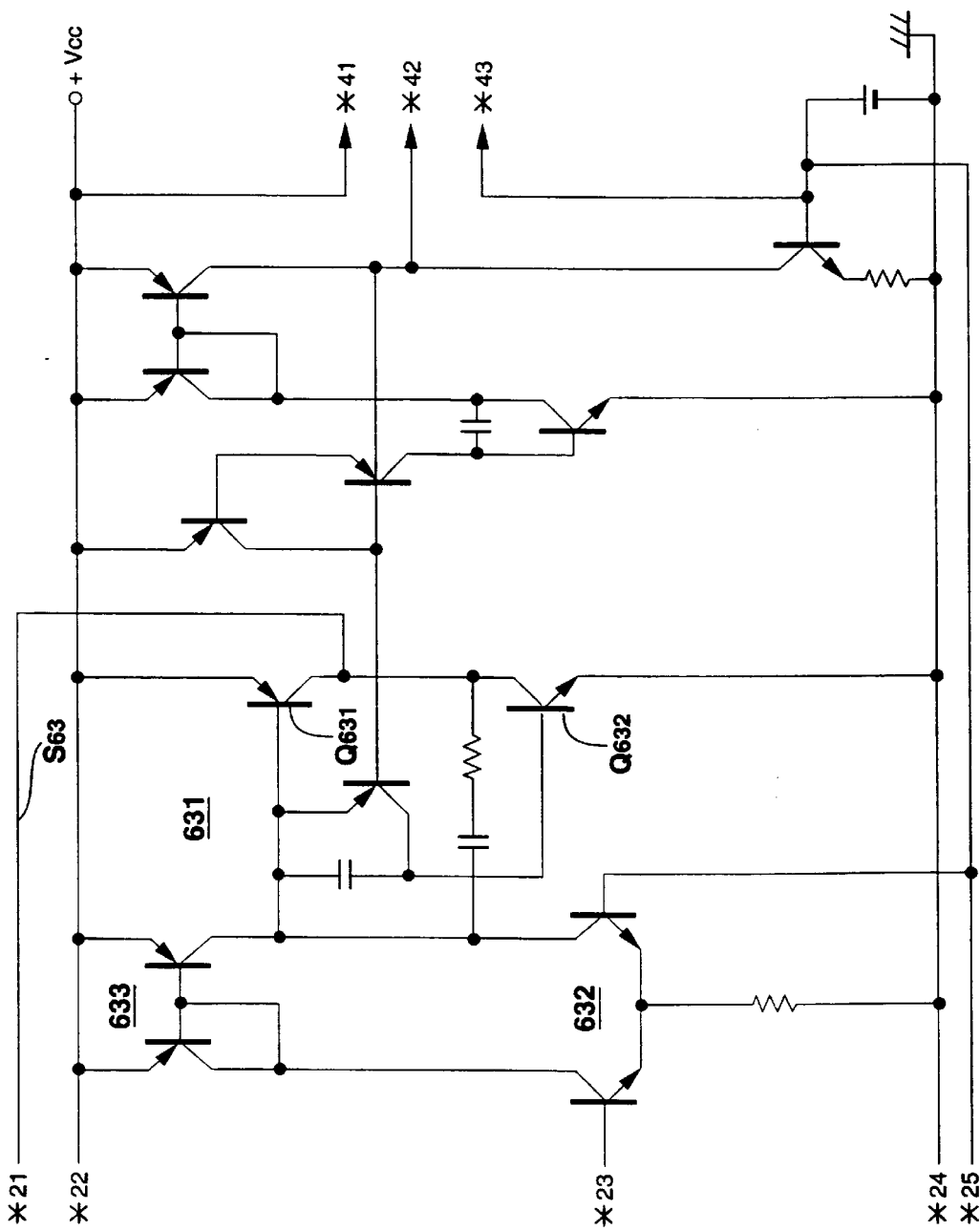
FIG. 12 is a connection diagram showing a continuation of the embodiment of FIG. 11.
Figure 13:
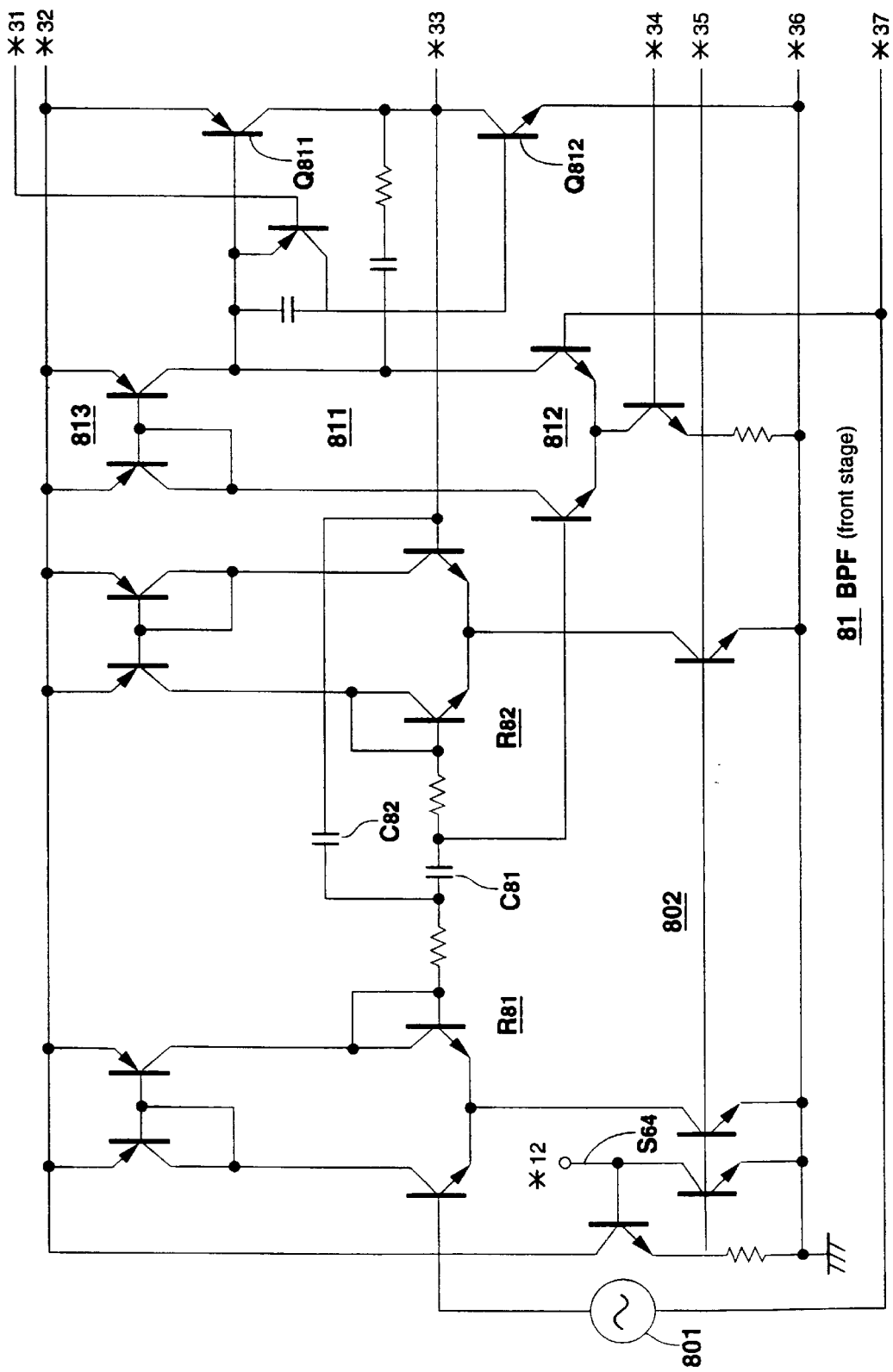
FIG. 13 is a circuit diagram showing a continuation of the embodiment of FIG. 10.
Figure 14:
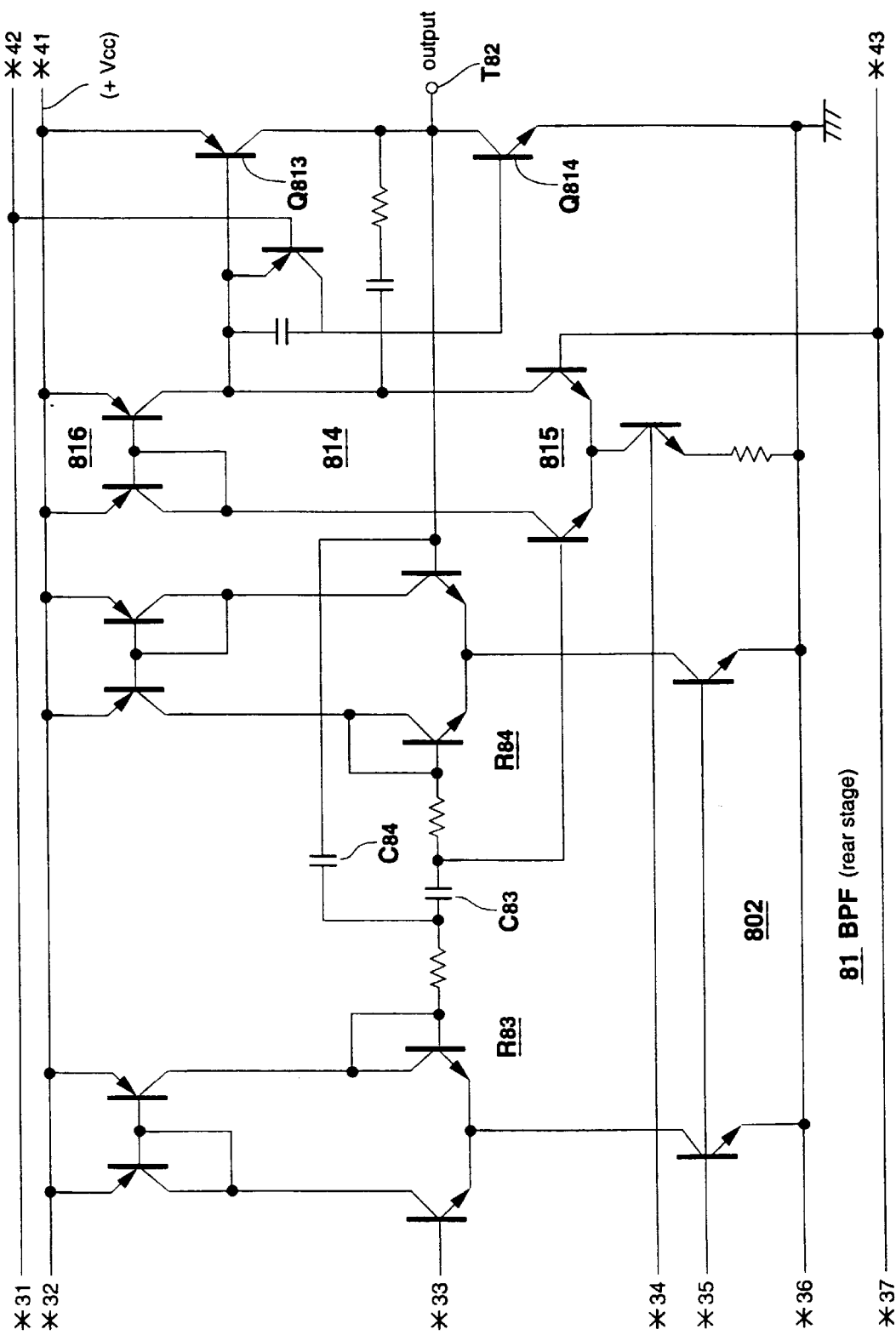
FIG. 14 is a circuit diagram showing a continuation of the embodiment of FIG. 13.

FIG. 9 shows a specific example of the phase comparator circuit 62 of FIG. 4. In this example, the phase comparator circuit 62 is constructed from a double-balance-type multiplication circuit. i.e. a differential amplifier 621 is constructed by connecting the emitters of transistors Q621 and Q622 to the collector of a constant current source transistor Q623 with the emitter being grounded. Further, a differential amplifier 622 is composed by connecting the emitters of transistor Q624 and Q625 to the collector of transistor Q621 and a differential amplifier 623 is composed by connecting the emitters of transistors Q626 and Q627 to the collector of transistor Q626.

A signal S63 is then supplied between the base of transistor Q621 and the base of transistor Q622 and a signal S61 is supplied between the bases of transistor Q624 and Q627 and the bases of transistors Q625 and Q626.

Therefore, pulse currents are outputted from the collectors of the transistors Q624 and Q626 and the collectors of transistors Q625 and Q627 with opposite phase and pulse widths corresponding to the phase difference between signal S63 and signal S61.

The output currents of the transistors Q624 and Q626 are provided to the current mirror circuit 626 via the current mirror circuit 624 and the output current of the transistors Q625 and Q627 are provided to the current mirror circuit 625. A common load resistor R621 is connected to the current mirror circuits 624 and 626.

Therefore, a pulse voltage is obtained across the resistor R621 with a frequency equal to those of the signals S61 and S63 and a pulse width corresponding to the phase difference between the signals S61 and S63. This pulse output is then integrated to provide a d.c. level that changes in accordance with the phase difference between the signal S61 and the signal S63, so that this circuit operates as the phase comparator circuit 62.

FIGS. 10 to 14 show specific examples of circuits 62 to 64 and a band-pass filter in which the characteristics are corrected. In FIG. 10 to FIG. 14, the numerals *11 to *43 show that lines with corresponding numerals are connected to each other.

Then, the balanced frequency divided signal S61 is provided to the phase comparator circuit 62 via a differential amplifier 71 and the emitter-follower transistors Q71 and Q72. This phase comparator circuit 62 is constructed from a double-balanced multiplication circuit as described above.

Further, the signal S61 is provided from the transistors Q71 and Q72 to a differential amplifier 72 via emitter-follower transistors Q73 and Q74. Also, a load resistor R731 is connected to this differential amplifier 72 via a current mirror circuit 73 and a signal S61 that is converted from a balanced-type signal to an unbalanced-type signal is extracted across this resistor R731. This signal S61 is then provided to the phase-shifting circuit 63.

This phase-shifting circuit 63 is composed of a secondary filter described in FIG. 6 and the variable resistors R62 and R63 are constructed as has been described in FIG. 8. The amplifier 631 of the phase-shifting circuit 63 is composed of a differential amplifier 632, a current mirror circuit 633 and output transistors Q631 and Q632.

The phase-shifting signal S63 is extracted from the transistors Q631 and Q632 and this signal is provided to the differential amplifier 621 of the phase comparator circuit 62.

A pulse voltage with a pulse-width corresponding to the phase-difference between signal S61 and signal S63 is therefore outputted at the load resistor R621 of the phase comparator circuit 62.

Then, the resistor R621 composes a low-pass filter with a capacitor C641 being connected thereto and a d.c. voltage whose level changes in accordance with the phase difference between signal S61 and signal S63, i.e. the signal S64, is extracted. This signal S64 is then converted into a signal current by the transistor Q641 and supplied to the transistor Q751.

This transistor Q751 forms a current mirror circuit 75 together with transistors Q752 to Q754, with transistor Q751 being on the input side and transistors Q752 to Q754 being on the output side. The signal S64 is therefore outputted from transistors Q752 to Q754 as an electric current.

The signal current S64 from the transistor Q752 is provided to the transistor Q104 on the input side of the current mirror circuit 102 forming the variable resistance circuits R62 and R63. The variable resistance circuits R62 and R63 are therefore controlled by the signal current 64 so that the phase delay in the base-shifting circuit 63 becomes 90°, which makes the cut-off frequency of the phase-shifting circuit 63 become equal to the frequency of the signal S61.

Further, at this time, the central frequency for the main band-pass filter 80 is controlled to be the design value by the signal current S64 outputted from another transistor Q753 on the output side of the current mirror circuit 75.

Figure 5:
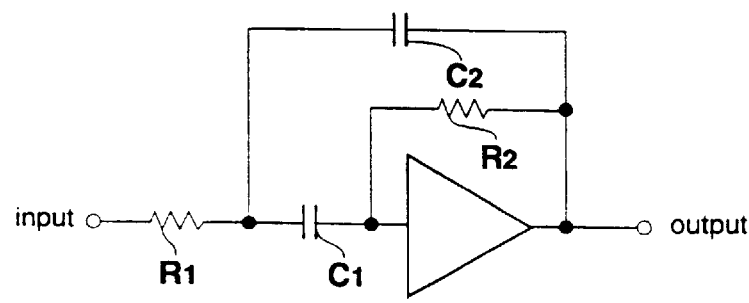
FIG. 5 is a circuit diagram showing an example of a band-pass filter.

In this embodiment, the band-pass filter 81 is equivalent to two stages of the band-pass filter shown in FIG. 5 connected in a cascade, with the resistances R1 and R2 being made to be variable resistance circuits, the resistance value of which being controlled by the signal current S64.

That is, a signal source 801 is connected to the input terminal of a differential amplifier 812 via a variable resistance circuit R81 and a capacitor C81. This differential amplifier 812 composes an inverting amplifier 811 together with a current mirror circuit 813 and output transistors Q811 and Q812. A capacitor C82 is connected between the output terminal of the inverting amplifier 811 and the connection point of a variable resistance circuit R81 and a capacitor C81. Further, a variable resistance circuit R82 is connected between the output terminal and the input terminal of the amplifier 811.

The front stage (first stage) of the band-pass filter 81 is thus constructed. The signal current S64 from the transistor Q752 in the current mirror circuit 75 is provided as a control signal to the variable resistance circuits R81 and R82 via the current mirror circuit 802.

The output terminal of the amplifier 811 is connected to the input terminal of the differential amplifier 815 via the variable resistance circuit R83 and the capacitor C83. This differential amplifier 815 composes an inverting amplifier 814 together with a current mirror circuit 816 and output transistors Q813 and Q814. The output terminal of this inverting amplifier 814 is connected to the output terminal T82.

Further, a capacitor C84 is connected between the output terminal of the inverting amplifier 814 and the connection point of the variable resistance circuit R83 and the capacitor C83, and a variable resistance circuit R84 is connected between the output terminal of the inverting amplifier 814 and the input terminal thereof.

The rear stage (second stage) of the band-pass filter 81 is then constructed. The signal current S64 from the transistor Q752 of the current mirror circuit 75 is then provided as a control signal to the variable resistance circuits R83 and R84 via the current mirror circuit 802.

The central frequency of the low-pass filter circuit 50 is therefore adjusted to the design value by the signal S64.

In the above, the filter having an adjusted cut-off frequency (central frequency) is a low-pass filter or a band-pass filter. However, this invention can be applied to any filter circuit which has a phase characteristic similar to that of the phase-shifting circuit 63 at around the reference frequency.

According to this invention, cut-off frequencies (central frequency) of every filter can be determined to be the frequency f31 of the signal S31 as a reference. Thus, when they are integrated into an IC, the cut-off frequencies will not deviate from the design values even if the values of the resistors and capacitors composing the filter circuit vary each other.

Further, the cut-off frequency will not change due to changes in temperature. Moreover, the circuit can be provided without generating noise such as clock noise, requiring adjustments after fabrication and showing secular variation.

While the invention has been particularly shown and described with reference to preferred embodiment thereof, it will be understood by those skilled in the art that the foregoing and other changes in form and details can be made therein without departing from the spirit and scope of the invention.

What is claimed is:

1. A filter device for use in a base unit and in a portable unit of a cordless telephone system, comprising:

an integrated circuit chip having formed thereon a receiving circuit and a transmitting circuit;

an oscillator circuit for generating a reference signal formed on said integrated circuit chip;

a first low-pass filter circuit connected between an input terminal and an output terminal of said filter device for receiving a signal to be filtered and having a first variable time constant circuit including a first variable resistance, said first low-pass filter circuit being constructed of a first set of active elements formed on said integrated circuit chip;

a second low-pass filter circuit identical to said first low-pass filter circuit and having a second variable time constant circuit including a second variable resistance and supplied with said reference signal from said oscillator circuit as an input signal for shifting a phase of said reference signal by an amount set by said second variable time constant circuit and producing a phase-shifted output signal, said second low-pass filter circuit being constructed of a second set of active elements formed on said integrated circuit chip;

a phase-comparator circuit for receiving said reference signal and said phase-shifted output signal directly from said second low-pass filter circuit and comparing said phase of said reference signal with a phase of said phase-shifted output signal of said second low-pass filter circuit to generate a phase-comparator output signal based on said comparison, said phase-comparator circuit being constructed of a third set of active elements formed on said integrated circuit chip; and a third low-pass filter for averaging said phase-comparator output signal and supplying an averaged output signal to both said first and second variable resistances of said first and second variable time constant circuits of said first and second low-pass filter circuits, said averaged output signal serving as a control signal to adjust time constants of said first and second variable time constant circuits by varying said first and second variable resistances, so that a cut-off frequency of said first low-pass filter equals a cut-off frequency of said second low-pass filter, said third low-pass filter being constructed of a fourth set of active elements formed on said integrated circuit chip, and said first and second variable resistances are determined by respective variable resistance circuits each comprising a differential amplifier connected to first and second current mirrors such that respective resistance values of said respective variable resistance circuits vary with a variation of said phase comparator output signal, wherein said differential amplifier and at least one of said first and second current mirrors has ground as a reference potential.

2. The filter device according to claim 1, wherein during stable operation said second low-pass filter circuit has a cut-off frequency equal to a frequency of said reference signal.

3. The filter device according to claim 1, wherein during stable operation a phase of said input signal to said second low-pass filter circuit and a phase of said phase-shifted output signal from said second low-pass filter circuit differ by 90 degrees at a cut-off frequency of said second low-pass filter circuit.

4. The filter device according to claim 1, wherein during stable operation said phase-comparator output signal is substantially zero when a phase difference between said reference signal and said phase-shifted output signal of said second low-pass filter circuit is 90 degrees.

* * * * *